United States Patent
Kim

(10) Patent No.: US 8,642,428 B2
(45) Date of Patent: Feb. 4, 2014

(54) SEMICONDUCTOR DEVICE INCLUDING LINE-TYPE ACTIVE REGION AND METHOD FOR MANUFACTURING THE SAME

(75) Inventor: Kyung Do Kim, Seoul (KR)

(73) Assignee: Hynix Semiconductor Inc., Icheon (KR)

( * ) Notice: Subject to any disclaimer, the term of this patent is extended or adjusted under 35 U.S.C. 154(b) by 58 days.

(21) Appl. No.: 12/983,119

(22) Filed: Dec. 31, 2010

(65) Prior Publication Data

US 2012/0146121 A1    Jun. 14, 2012

(30) Foreign Application Priority Data

Dec. 13, 2010  (KR) ......................... 10-2010-0127224

(51) Int. Cl.
*H01L 21/336* (2006.01)

(52) U.S. Cl.
USPC ........... 438/270; 438/330; 438/303; 438/942; 438/947; 257/E21.023; 257/E21.038; 257/E21.039

(58) Field of Classification Search
USPC .......... 257/330, 202–211, E21.023, E21.038, 257/E21.039; 438/230, 270, 303, 942, 943
See application file for complete search history.

(56) References Cited

U.S. PATENT DOCUMENTS

| | | | |
|---|---|---|---|
| 8,026,179 B2* | 9/2011 | Lue | 438/703 |
| 2006/0197177 A1* | 9/2006 | Yeom | 257/510 |
| 2009/0042391 A1* | 2/2009 | Chen | 438/692 |

FOREIGN PATENT DOCUMENTS

| | | |
|---|---|---|
| KR | 1020050034879 A | 4/2005 |
| KR | 1020050038425 A | 4/2005 |
| KR | 100811373 B1 | 2/2008 |
| KR | 1020080059019 A | 6/2008 |

* cited by examiner

*Primary Examiner* — Kimberly Rizkallah
*Assistant Examiner* — Maria Ligai

(57) ABSTRACT

A semiconductor device having a line-type active region and a method for manufacturing the same are disclosed. The semiconductor device includes an active region configured in a successive line type, at least one active gate having a first width and crossing the active region, and an isolation gate having a second width different from the first width and being formed between the active gates. The isolation gate's width and the active gate's width are different from each other to guarantee a large storage node contact region, resulting in increased device operation characteristics (write characteristics).

9 Claims, 6 Drawing Sheets

SEMICONDUCTOR DEVICE INCLUDING LINE-TYPE ACTIVE REGION AND METHOD FOR MANUFACTURING THE SAME

CROSS-REFERENCE TO RELATED APPLICATION

The priority of Korean patent application No. 10-2010-0127224 filed on Dec. 13, 2010, the disclosure of which is hereby incorporated in its entirety by reference, is claimed.

BACKGROUND OF THE INVENTION

Embodiments of the present invention relate to a semiconductor device having a line-type active region, and more particularly, to a semiconductor device where the width of an isolation gate for device isolation in the line-type active region is different from the width of an active gate so as to guarantee a wide storage node contact region, thereby improving device operation characteristics (write characteristics).

As is well known in the art, a semiconductor device, such as a DRAM, must have a small unit cell size to reach a higher degree of integration.

However, as the cell transistor becomes smaller in size, the driving current is reduced and the leakage current is increased due to the short channel effect. A buried gate structure based on a metal gate has been proposed to reduce the leakage current while increasing the integration degree of the cell transistor. In addition, a method for forming a line-type active region along with a buried gate and a method for isolating an active region using an isolation gate have been intensively studied.

However, as a semiconductor device that has a line-type active region is gradually decreased in size, the storage node contact area of the semiconductor device is gradually reduced as well, resulting in deterioration of write characteristics of cell operation.

BRIEF SUMMARY OF THE INVENTION

Various embodiments of the present invention are directed to providing a semiconductor device that has a line-type active region, and a method for manufacturing the same, that substantially obviates one or more of the problems resulting from the limitations and disadvantages of the conventional art.

An embodiment of the present invention relates to a technology configured to improve a semiconductor structure with an active-type active region so as to guarantee a sufficiently-sized storage node contact region, resulting in an increase in cell operation characteristics.

In accordance with an aspect of the present invention, a semiconductor device includes an active region extending along a first direction; at least one active gate having a first width and crossing the active region; and first and second isolation gates having a second width different from the first width, the first and second isolation gates isolating the active region.

The second width may be smaller than the first width. The active gate and the isolation gate may be buried gates.

The active region may be formed angled with respect to a word line or a bit line each running across the active region.

In accordance with another aspect of the present invention, a method for manufacturing a semiconductor device includes forming a device isolation film to define a line-type active region; forming a first hard mask pattern over the active region; forming a first spacer at first and second sidewalls of the first hard mask pattern; forming a second hard mask pattern including the first spacer; forming a second spacer at first and second sidewalls of the second hard mask pattern; removing the first spacer and the second spacer to form a gate pattern; etching the active region and the device isolation film using the gate pattern as an etch mask to form a trench for a gate; and forming a gate in the gate trench.

The forming of the first spacer may include forming an oxide film for the first spacer over the surface of the first hard mask pattern; forming a first polysilicon layer over the oxide film for the first spacer so as to fill a gap between the first hard mask patterns; and etching and planarizing the first polysilicon layer and the oxide film for the first spacer such that the first hard mask pattern is exposed.

The forming of the second hard mask pattern may include forming a photoresist pattern that covers the first spacer oxide film and overlaps some parts of the first hard mask pattern and the first polysilicon layer, and etching the first hard mask pattern and the first polysilicon layer using the photoresist pattern as an etch mask.

The forming of the second spacer may include forming an oxide film for the second spacer over the second hard mask pattern; forming a second polysilicon layer over the second spacer oxide film so as to fill a gap between the second hard mask patterns; and etching and planarizing the second polysilicon layer and the second spacer oxide film such that the second hard mask pattern is exposed.

The method for manufacturing the semiconductor device may further include forming a gate oxide film over the gate so as to fill the gate trench, and forming a source junction region and a drain junction region in the active regions at both sides of the gate oxide film.

The first spacer and the second spacer may have different thicknesses, respectively. The first spacer may be thinner than the second spacer.

In accordance with another aspect of the present invention, a method for manufacturing a semiconductor device includes forming a line-type active region; and forming an active gate and an isolation gate, having different widths, in such a manner that both of the active gate and the isolation gate are running crossed over the active region, wherein the isolation gate isolating the active region.

The forming of the active gate and the isolation gate may include forming a spacer for the isolation gate over the active region; forming a spacer for the active gate at both sides of a spacer for the isolation gate; removing the isolation gate spacer and the active gate spacer; etching the active region of the corresponding region, thus forming a trench for the gate; and forming a conductive film in a lower part of the gate trench.

The forming of the isolation gate spacer may include forming a first hard mask pattern over the active region, and forming a first spacer oxide film at both sidewalls of the first hard mask pattern.

The forming of the active gate spacer may include exposing the top surface of the first spacer oxide film; forming a polysilicon layer to fill a gap between the first hard mask patterns; forming a photoresist pattern that covers the exposed first spacer oxide film and overlaps some parts of the first hard mask pattern and the first polysilicon layer, which is at both sides of the first spacer oxide film; etching the first hard mask pattern and the first polysilicon layer using the photoresist pattern as an etch mask; to form a second hard mask pattern; and forming an oxide film for a second spacer at both sidewalls of the second hard mask pattern.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
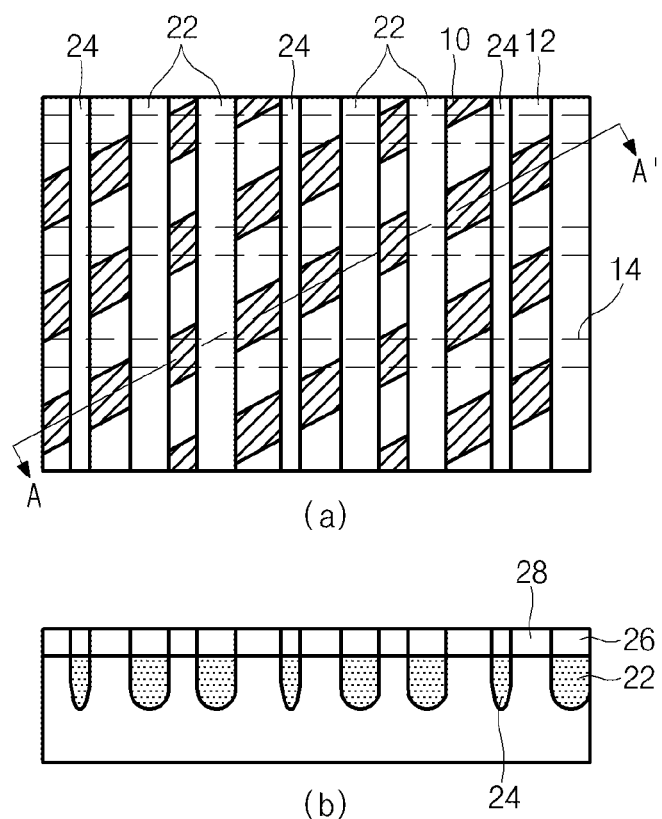
FIG. 1 is a gate structure of a semiconductor device having a line-type active region according to an embodiment of the present invention.

FIG. 1 is a gate structure of a semiconductor device having a line-type active region according to one embodiment of the present invention. FIG. 1A is a plan view illustrating the semiconductor device having the line-type active region according to one embodiment of the present invention. FIG. 1B is a cross-sectional view illustrating the semiconductor device taken along the line A-A' of FIG. 1A.

Referring to FIG. 1, the semiconductor device includes line-type active regions 10 in which active regions 10 are parallel and are spaced apart from each other by a predetermined distance, and in which active gates 22 extend in parallel to isolation gates 24 in the active region 10. That is, according to the semiconductor device of the present invention, the active region 10 defined by a device isolation film 12 is not formed in an island type, but is formed in a successive line type. In this case, an appropriate bias voltage may be applied to the isolation gate 24 or may be maintained in an OFF state, such that the isolation gate 24 prevents a current from flowing through a substrate under the isolation gate 24. As a result, active regions 10, formed at both sides of the isolation gate 24, are electrically isolated from each other.

The active gates 22 and the isolation gates 24 are formed in a silicon substrate in the form of a buried gate.

One common bit line contact (not shown) is formed over an active region 10 between neighboring active gates 22. A storage node contact (not shown) is formed in an active region 10 between an active gate 22 and an isolation gate 24.

Specifically, according to an embodiment of the present invention, the width of the active gates 22 is different from the width of the isolation gates 24. The width of the isolation gates 24 is narrower than that of the active gates 22, thereby securing a larger storage node contact region than if the widths of the isolation gates 24 and the active gates 22 were identical.

In addition, when the line-type active region 10 is tilted by a predetermined angle with respect to a bit line 14 or a word line 22, 24, a bit line contact region can be formed in a larger size as compared with a case where the active region is not tilted, resulting in a reduction in contact resistance.

A gate oxide layer 26 is formed over the active gates 22 and the isolation gates 24. The source/drain junction region 28, in which impurities (N-type impurities) are implanted, is formed in the active region between the active gates 22 and the isolation gates 24.

FIGS. 2A to 2I are cross-sectional views illustrating the order of fabrications for manufacturing the semiconductor device shown in FIG. 1 according to an embodiment of the present invention. FIGS. 2A to 2I are cross-sectional views illustrating the semiconductor device taken along the line A-A' of FIG. 1A.

Figure 2A:
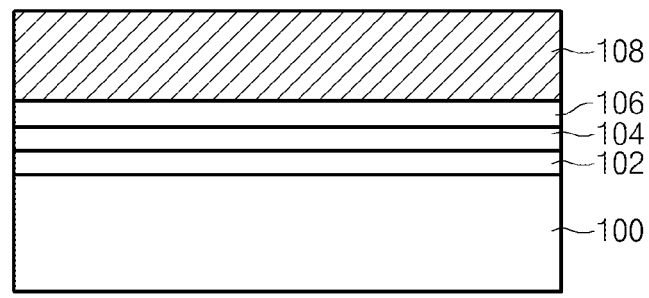
FIGS. 2A to 2I are cross-sectional views illustrating the order of fabrication for manufacturing the semiconductor device shown in FIG. 1.

Referring to FIG. 2A, a silicon substrate is etched using a mask defining an active region, such that a line type STI trench (not shown) is formed. Subsequently, an insulation film is formed filling in the STI trench to form a device isolation film, such that a successive line-type active region (See reference number '10' of FIG. 1) is formed.

The method for forming the device isolation film may be carried out using a common STI process, and a detailed description thereof will herein be omitted for convenience of description.

A pad polysilicon layer 102 doped with N-type impurities is formed over the entire surface including the active region 100 and the device isolation film. A nitride film 104, a hard mask Tetraethyl Orthosilicate (TEOS) layer 106, and a hard mask polysilicon layer 108 are sequentially formed over the pad polysilicon layer 102.

Figure 2B:
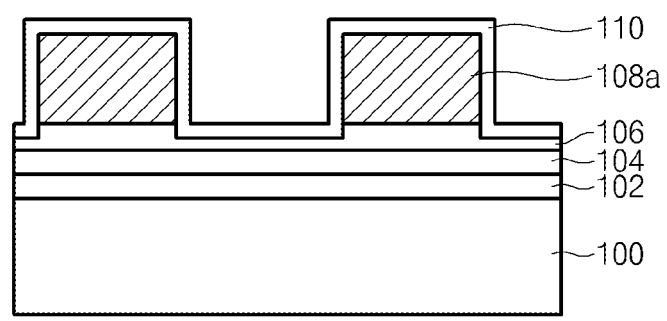

Referring to FIG. 2B, the hard mask polysilicon layer 108 is etched using a mask for forming an isolation gate spacer, thereby forming first hard mask patterns 108a. In this case, the surface of the hard mask TEOS layer 106, which is exposed between the first hard mask patterns 108a, may be partially etched.

The oxide film 110 for a first spacer is formed over the first hard mask patterns 108a and the hard mask TEOS layer 106 that had been exposed by etching the first hard mask polysilicon layer 108. That is, a spacer for forming an isolation gate is formed at sidewalls of the first hard mask patterns 108a.

In this case, the first spacer oxide film 110, formed at sidewalls of the first hard mask patterns 108a, has the same thickness as the isolation gate 24 shown in FIG. 1. That is, according to an embodiment of the present invention, the thickness of the first spacer oxide film 110 defines the thickness of the isolation gate 24.

Figure 2C:
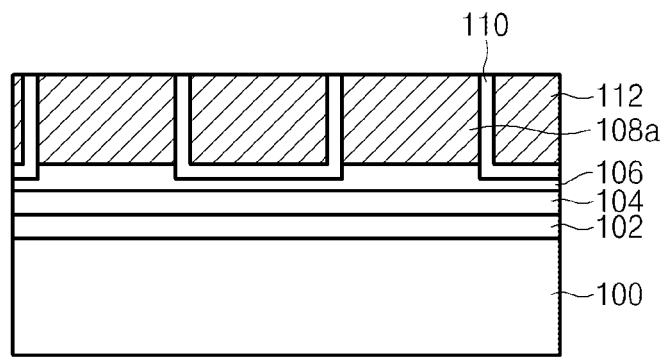

Referring to FIG. 2C, the polysilicon layer 112 is formed over the first spacer oxide film 110 such that the gap between the first hard mask patterns 108a is filled with the polysilicon layer 112. Subsequently, the polysilicon layer 112 and the first spacer oxide film 110 are etched and planarized until the first hard mask pattern 108a is exposed. That is, the first spacer oxide film 110 is removed from the top surface of the hard mask patterns 108a.

Figure 2D:
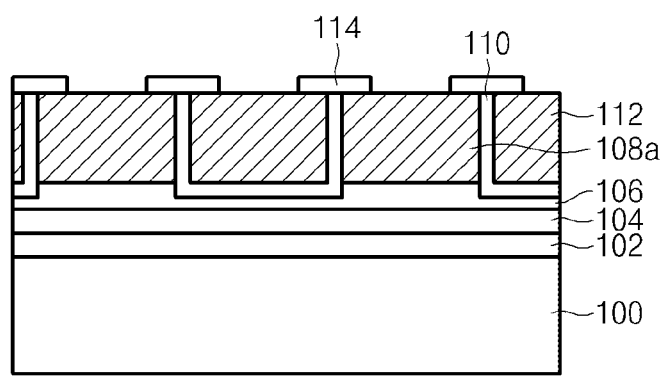

Referring to FIG. 2D, a photoresist film (not shown) is formed over the hard mask patterns 108a, the polysilicon layer 112, and the first spacer oxide film 110. Subsequently, the photoresist film is patterned using a mask to define a spacer for the active gate, so that the photoresist film pattern 114 is formed.

The photoresist film 114 is formed to completely cover the exposed first spacer oxide film 110, and to overlap predetermined regions of the first hard mask patterns 108a and the polysilicon layer 112, which are formed at both sides of the first spacer oxide film 110.

Figure 2E:
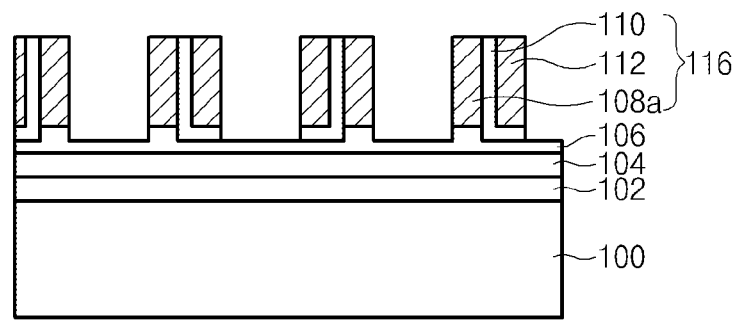

Referring to FIG. 2E, the first hard mask patterns 108a, the polysilicon layer 112, and the first spacer oxide film 110 formed under the polysilicon 112 are etched using the photoresist pattern 114 as an etch mask until the hard mask TEOS layer 106 is exposed, thereby forming a second hard mask pattern 116. That is, the second hard mask pattern 116, which includes the first spacer oxide film 110, is formed.

Figure 2F:
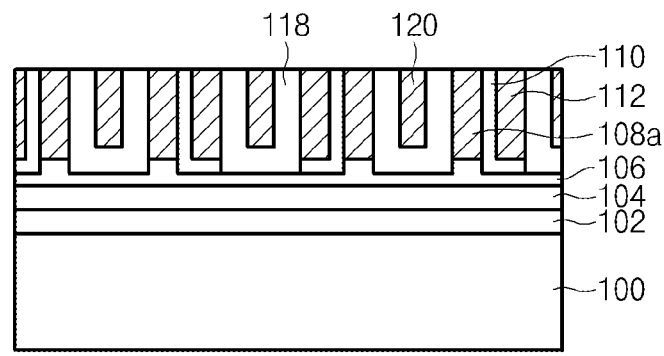

Referring to FIG. 2F, the second spacer oxide film 118 for forming the active gate spacer is formed over the second hard mask pattern 116 and over the exposed hard mask TEOS layer 106. That is, a spacer for forming the active gate is formed at sidewalls of the second hard mask pattern 116.

The second spacer oxide film 118 is formed to have the same thickness as that of the active gate 22, and is thicker than the first spacer oxide film 110. The thickness of the second spacer oxide film 118 thus defines the thickness of the active gate 22.

Subsequently, the polysilicon layer 120 is formed over the second spacer oxide film 118 such that the gap between the second spacer oxide film 118 is filled with the polysilicon layer 120. Next, the polysilicon layer 120 and the second spacer oxide film 118 are etched and planarized until the first spacer oxide film 110 is exposed. The first spacer oxide film 110 and the second spacer oxide film 118, formed at sidewalls of the hard mask patterns 108a and the second hard mask pattern 116, are exposed. Accordingly, the second spacer oxide film 118 formed at sidewalls of the second hard mask pattern 116 is diagonally formed at both sides of the first spacer oxide film 110 formed at sidewalls of the first hard mask pattern 108a.

Figure 2G:
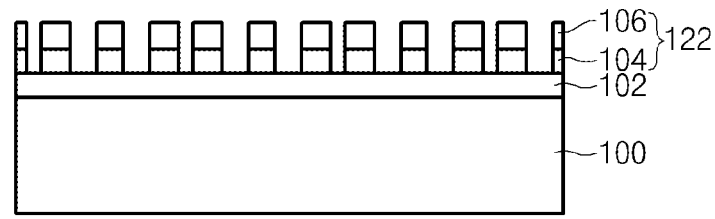
Figure 2H:
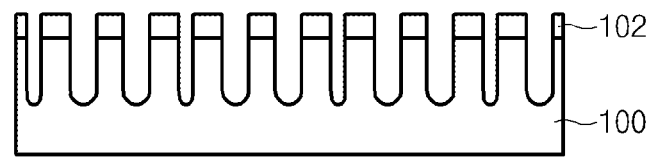

Referring to FIG. 2G, the first spacer oxide film 110, which is formed at sidewalls of the hard mask pattern 108a and contained in the second hard mask pattern 116, and the second spacer oxide film 118 are removed so that a gate pattern (not shown) for defining a gate region is formed. That is, gate patterns which define the active gate region (i.e., the region from which the second spacer oxide film is removed) and the isolation gate region (i.e., the region from which the first spacer oxide film is removed), are formed.

The process for removing the first spacer oxide films 110 and the second spacer oxide film 118, which are formed at sidewalls of the hard mask patterns 108a and the second hard mask pattern 116, may be carried out using a conventional spacer patterning technology (SPT).

After the first spacer oxide film 110 and the second spacer oxide film 118 are removed, the hard mask TEOS layer 106 and the nitride film 104 under the first spacer oxide film 110 and the second spacer oxide film 118 are etched.

Subsequently, the second hard mask pattern 116, the polysilicon layer 120, and the remaining first spacer oxide film 110 under the polysilicon layer 120 are removed.

Therefore, the gate regions, i.e., the active gate region and the isolation gate region, are defined, and a hard mask pattern 122, including a laminated structure of the nitride film 104 and the hard mask TEOS layer 106, is formed.

In the present embodiment, a wide region, shown in FIG. 2G, is an active gate region, and a narrow region, also shown in FIG. 2G, is an isolation gate region.

Referring to FIG. 2G, the polysilicon layer 102, the active region 100, and the device isolation film (not shown) are etched using the hard mask pattern 122 as an etch mask, thereby forming a trench for a gate. Subsequently, the hard mask pattern 122, i.e., a stack of the nitride film 104 and the hard mask TEOS layer 106, is removed.

Figure 2I:
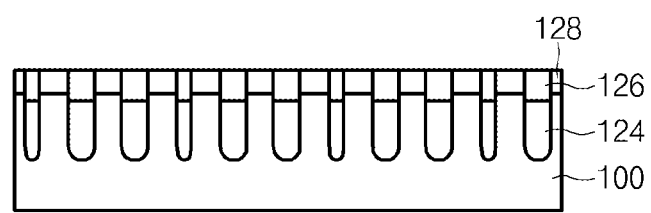

Referring to FIG. 2I, a gate conductive film (not shown) is formed to fill the gate trench, and is etched back, so that the buried gate 124 is formed in the gate trench. In this case, a metal film may be employed as the gate conductive film. A tungsten (W) layer or a nitride titanium layer may be used as the metal film.

The gate oxide film 126 is formed over the buried gate 124 so that the gate trench is filled by the gate oxide film 126. Then, the gate oxide film 126 is planarized to expose the pad polysilicon layer 102.

Subsequently, N-type impurities are diffused into the active region 100 by a heat treatment process, thereby forming the source/drain junction region 128.

As is apparent from the above description, a semiconductor device, and a method for forming the same according to an embodiment of the present invention, has an isolation gate having a smaller thickness than that of an active gate, such that a wide storage node contact region can be guaranteed, thereby resulting in increased operation characteristics of the device.

An embodiment of the present invention forms a gate using the SPT and isolates the active gate using an isolation gate. The thickness of the active gate is different from that of the isolation gate.

It will be apparent to those skilled in the art that various modifications and variations can be made in the present invention without departing from the spirit or scope of the invention. Thus, it is intended that the present invention covers modifications and variations of this invention provided they come within the scope of the appended claims and their equivalents.

The above embodiments of the present invention are illustrative and not limitative. Various alternatives and equivalents are possible. The invention is not limited by the type of deposition, etching, polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device comprising:
    forming a device isolation film defining a line-type active region;
    forming a first hard mask pattern over the active region;
    forming a first spacer at first and second sidewalls of the first hard mask pattern;
    forming a second hard mask pattern including the first spacer;
    forming a second spacer at first and second sidewalls of the second hard mask pattern;
    removing the first spacer and the second spacer to form a gate pattern;
    etching the active region and the device isolation film using the gate pattern as an etch mask to form a trench for a gate; and
    forming a gate in the gate trench.

2. The method according to claim 1, wherein the forming of the first spacer includes:
    forming an oxide film for the first spacer over the first hard mask pattern;
    forming a first polysilicon layer over the oxide film for the first spacer to fill a gap between neighboring first hard mask patterns; and
    etching and planarizing the first polysilicon layer and the oxide film for the first spacer such that the first hard mask pattern is exposed.

3. The method according to claim 2, wherein the forming of the second hard mask pattern includes:
    forming a photoresist pattern that covers the first spacer oxide film and overlaps with a portion of the first hard mask pattern and a portion of the first polysilicon layer; and etching the first hard mask pattern and the first polysilicon layer using the photoresist pattern as an etch mask.

4. The method according to claim 3, wherein the forming of the second spacer includes:
forming an oxide film for the second spacer over the second hard mask pattern;
forming a second polysilicon layer over the second spacer oxide film so as to fill a gap between neighboring second hard mask patterns; and
etching and planarizing the second polysilicon layer and the second spacer oxide film such that the second hard mask pattern is exposed.

5. The method according to claim 1, further comprising:
forming a gate oxide film over the gate so as to fill the gate trench; and
forming a source junction region and a drain junction region in the active region formed at both sides of the gate oxide film.

6. The method according to claim 1, wherein the first spacer and the second spacer have different thicknesses, respectively.

7. The method according to claim 6, wherein the first spacer is thinner than the second spacer.

8. A method for manufacturing a semiconductor device comprising:
forming a line-type active region;
forming a first hard mask pattern over the active region;
forming a first isolation gate spacer and a second isolation gate spacer at both sidewalls of the first hard mask pattern, respectively;
forming a first active gate spacer at both sides of the first isolation gate spacer and a second active gate spacer at both sides of the second isolation gate spacer;
removing the first and the second isolation gate spacer and the first and the second active gate spacer;
etching the active region corresponding to the first and the second isolation gate spacer and the first and the second active gate spacer, and thus forming a trench for a gate; and
forming a conductive film in a lower part of the gate trench.

9. The method according to claim 8, wherein the forming of the first and the second active gate spacer includes:
forming a second hard mask pattern to fill a gap between neighboring first hard mask patterns;
forming a photoresist pattern that covers the first and the second isolation gate spacer and overlaps with a portion of the first hard mask pattern and the polysilicon layer;
etching the first hard mask pattern and the polysilicon layer using the photoresist pattern as an etch mask to form a second hard mask pattern; and
forming an oxide film at both sidewalls of the second hard mask pattern.

* * * * *